United States Patent
Higuchi

(10) Patent No.: US 7,398,424 B2
(45) Date of Patent: Jul. 8, 2008

(54) FALSE PATH DETECTION PROGRAM

(75) Inventor: Hiroyuki Higuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 434 days.

(21) Appl. No.: 10/827,690

(22) Filed: Apr. 19, 2004

(65) Prior Publication Data

US 2005/0120271 A1 Jun. 2, 2005

(30) Foreign Application Priority Data

Nov. 19, 2003 (JP) ............................. 2003-389185

(51) Int. Cl.
*G06F 11/00* (2006.01)

(52) U.S. Cl. ............................. 714/30; 714/726; 716/4; 716/5; 716/6

(58) Field of Classification Search .................. 714/30, 714/726
See application file for complete search history.

(56) References Cited

U.S. PATENT DOCUMENTS

| | | | | |
|---|---|---|---|---|
| 5,448,497 | A | * | 9/1995 | Ashar et al. ..................... 716/6 |
| 5,659,486 | A | * | 8/1997 | Tamiya ........................ 709/245 |
| 5,675,728 | A | | 10/1997 | Kunda et al. ........... 395/183.04 |
| 6,330,698 | B1 | * | 12/2001 | Marinissen et al. .......... 714/726 |
| 6,510,535 | B1 | * | 1/2003 | Hosokawa et al. .......... 714/726 |
| 6,651,198 | B1 | * | 11/2003 | Wang ......................... 714/726 |
| 6,665,811 | B1 | * | 12/2003 | de Azevedo et al. ........... 714/4 |

(Continued)

FOREIGN PATENT DOCUMENTS

JP 2001-67484 3/2001

(Continued)

OTHER PUBLICATIONS

H. C. Chen et al.; "Path Sensitization in Critical Path Problem"; IEEE Trans. on Computer-Aided Design of Integrated Circuits; Feb. 1993; 12(2) pp. 196-207.

(Continued)

*Primary Examiner*—Scott T. Baderman
*Assistant Examiner*—Loan Truong
(74) *Attorney, Agent, or Firm*—Greer, Burns & Crain, Ltd.

(57) ABSTRACT

A false path detection program whereby passing points of signal lines constituting false paths are directly detected, thereby shortening the processing time necessary for the false path detection and the processing time of tools utilizing false path information. A storing section stores, in a storage device, circuit information about a circuit designed by a designer. A signal value generating section generates an impossible signal value with respect to a signal line in the circuit. A signal propagation inspecting section assigns the signal value generated by the signal value generating section to an input of a gate connected to the signal line with respect to which the signal value has been generated, and examines whether signal is propagated through the other input of the gate only when accompanied by the signal value. If signal is propagated through the other input of the gate, a passing point acquiring section acquires a passing point of the other signal line connected to the other input of the gate. A false path specifying section specifies a false path by the passing point acquired by the passing point acquiring section.

12 Claims, 11 Drawing Sheets

U.S. PATENT DOCUMENTS

| | | | |
|---|---|---|---|
| 6,714,902 B1 * | 3/2004 | Chao et al. | 703/14 |
| 6,715,105 B1 * | 3/2004 | Rearick | 714/30 |
| 6,952,812 B2 * | 10/2005 | Abadir et al. | 716/4 |
| 2001/0011363 A1 * | 8/2001 | Nishida et al. | 716/18 |
| 2002/0059213 A1 * | 5/2002 | Soga | 707/3 |
| 2002/0104065 A1 * | 8/2002 | Tsukiyama et al. | 716/6 |
| 2002/0112213 A1 * | 8/2002 | Abadir et al. | 716/4 |
| 2002/0174407 A1 | 11/2002 | Furusawa | 716/4 |
| 2002/0186682 A1 * | 12/2002 | Kawano et al. | 370/351 |
| 2003/0081702 A1 * | 5/2003 | Kubo et al. | 375/341 |
| 2004/0132224 A1 | 7/2004 | Tsukiyama et al. | |

FOREIGN PATENT DOCUMENTS

| | | |
|---|---|---|
| JP | 2002-279012 | 9/2002 |

OTHER PUBLICATIONS

S. Devadas et al.; "Computer of Floating Mode Delay in Combinational Circuits: Theory and Algorithms"; IEEE Trans. on Computer-Aided Design of Integrated Circuits; Dec. 1994; 12(12) pp. 1912-1923.

D. Brand et al.; "Timing Analysis Using Functional Analysis"; IEEE Trans. on Computer; Oct. 1988; 37(10) pp. 1309-1314.

* cited by examiner

| 21 CONSTANT SIGNAL LINE DATA | | |
|---|---|---|
| CONSTANT SIGNAL LINE | CONSTANT SIGNAL | PASSING POINT OF NODE THROUGH WHICH SIGNAL IS PROPAGATED ONLY WHEN ACCOMPANIED BY IMPOSSIBLE SIGNAL LINE VALUE |
| L12 | 0 | t13 |

FIG. 5

22 PAIRED SIGNAL LINE DATA

| PAIRED SIGNAL LINES | | PHASE DIFFERENCE | PASSING POINTS OF NODE PAIR THROUGH WHICH SIGNAL IS PROPAGATED ONLY WHEN ACCOMPANIED BY IMPOSSIBLE SIGNAL LINE VALUE | EXISTENCE OF PATH PASSING THROUGH NODE PAIR THROUGH WHICH SIGNAL IS PROPAGATED ONLY WHEN ACCOMPANIED BY IMPOSSIBLE SIGNAL LINE VALUE |
|---|---|---|---|---|
| NODE 1 | NODE 2 | | | |
| L4 | L5 | 0 | t3, t9 | 1 |
| L8 | L9 | 0 | — | 0 |
| L8 | L13 | 0 | — | 0 |
| L2 | L14 | 1 | — | 0 |

FIG. 6

23 IMPLICATION SIGNAL LINE DATA

| ANTECEDENT OF IMPLICATION | | CONSEQUENT OF IMPLICATION | | PASSING POINTS OF NODE PAIR THROUGH WHICH SIGNAL IS PROPAGATED ONLY WHEN ACCOMPANIED BY IMPOSSIBLE SIGNAL LINE VALUE | EXISTENCE OF PATH PASSING THROUGH NODE PAIR THROUGH WHICH SIGNAL IS PROPAGATED ONLY WHEN ACCOMPANIED BY IMPOSSIBLE SIGNAL LINE VALUE |
|---|---|---|---|---|---|
| NODE | VALUE | NODE | VALUE | | |
| L2 | 0 | L6 | 0 | t6 | 0 |
| L4 | 0 | L6 | 0 | — | 0 |
| L1 | 1 | L10 | 1 | — | 0 |

FIG. 7

24 SET IMPLICATION SIGNAL LINE DATA

| ANTECEDENT OF IMPLICATION | CONSEQUENT OF IMPLICATION | | NODE SET THROUGH WHICH SIGNAL IS PROPAGATED ONLY WHEN ACCOMPANIED BY IMPOSSIBLE SIGNAL LINE VALUE | EXISTENCE OF PATH PASSING THROUGH NODE SET THROUGH WHICH SIGNAL IS PROPAGATED ONLY WHEN ACCOMPANIED BY IMPOSSIBLE SIGNAL LINE VALUE |
|---|---|---|---|---|
| | NODE | VALUE | | |
| L2 = 1 AND L4 = 1 | L6 | 1 | — | 0 |

FIG. 8

FALSE PATH DETECTION PROGRAM

BACKGROUND OF THE INVENTION (1) Field of the Invention

The present invention relates to a false path detection program, and more particularly, to a false path detection program used for the timing analysis and verification of a digital circuit.

(2) Description of the Related Art

When designing semiconductor devices such as LSI circuits, CAD (Computer Aided Design) is used. Semiconductor circuits designed by CAD often include false paths that are not used in their functions.

CAD has the function of false path detection and timing analysis. With this function, where the maximum delay time from the input to the output of a certain circuit involves a delay time attributable to a false path, for example, the maximum delay time can be shortened so that the circuit can operate in a time shorter than the maximum delay time.

The following three methods are known as conventional methods for false path detection and timing analysis: The first method is to determine whether each of paths from the input to the output of a circuit is a false path or not (see, e.g., Unexamined Japanese Patent Publication No. H08-180098 (paragraph nos. [0014]-[0031]; FIGS. 2-11), and H.-C. Chen and D. H.-C. Du, Path sensitization in critical path problem, IEEE Transactions on Computer-Aided Design of Integrated Circuits, 12(2): 196-207, February 1993). There has also been proposed a method of using higher-level operation description information in determining whether each path is a false path or not (see, e.g., Unexamined Japanese Patent Publication No. 2002-342403 (paragraph nos. [0019]-[0032]; FIGS. 1-3)). The second method is to obtain the shortest possible delay time while decreasing the value of delay time by degrees from a certain upper limit value (see, e.g., S. Devadas, K. Keutzer, and S. Malik, Computation of floating mode delay in combinational circuits: Theory and algorithms, IEEE Transactions on Computer-Aided Design of Integrated Circuits, 12(12): 1913-1923, December 1993). In this method, the shortest possible delay time is obtained while ignoring a delay time attributable to a false path. The third method is a method (called dynamic timing analysis) in which delay times of input vectors (several input signals) are calculated by simulation (see, e.g., D. Brand and V. S. Iyengar, Timing analysis using functional analysis, IEEE Transactions on Computer, 37(10): 1309-1314, October 1988). There has also been proposed a method based on the third method and improved in efficiency (see, e.g., Unexamined Japanese Patent Publication No. 2001-67383 (paragraph nos. [0053]-[0069]; FIG. 1)). As seen from these publications, circuit design using CAD requires false path analysis.

However, in cases where the conventional false path analysis techniques are applied to large-scale, complex circuit design, considerable time is required for the analysis. In the first method in which the analysis is performed path by path, in extreme cases the number of paths exponentially increases with scale of circuit, requiring much time for the false path analysis. In the second method in which the value of delay time is decreased by degrees from a certain upper limit value, the number of times the false path analysis needs to be performed increases if the set range in which the delay time is decreased is narrow. In the third method in which input vectors are simulated, for n inputs, the false path analysis needs to be performed $2^n$ times, requiring impractically long computation time.

In the timing analysis, only false paths with critical timing or timing error may be detected to reduce the processing time needed for the false path analysis. In recent years, however, circuits with higher performance are demanded, and when such circuits are designed, there exist innumerable false paths with critical timing or timing error, making the detection of such false paths impractical.

Also, since innumerable false paths need to be automatically detected, a problem arises in that tools utilizing the false path information require increased processing time.

SUMMARY OF THE INVENTION

The present invention was created in view of the above circumstances, and an object thereof is to provide a false path detection program which directly detects passing points of signal lines constituting false paths, thereby shortening the processing time necessary for the false path detection and also permitting compact description of false path information.

To achieve the object, there is provided a false path detection program for detecting false paths of a designed circuit. The false path detection program causes a computer to function as storing means for receiving circuit information about the circuit and storing the circuit information in a storage device, signal value generating means for generating an impossible signal value with respect to a signal line in the circuit, signal propagation inspecting means for assigning the generated signal value to an input of a gate connected to the signal line and examining whether signal is propagated through the other input of the gate only when accompanied by the signal value, passing point acquiring means for acquiring a passing point of the other signal line connected to the other input of the gate if signal is propagated, and false path specifying means for specifying a false path by the passing point.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 5 is a diagram showing an exemplary data structure created by a constant signal line detection process;

FIG. 6 is a diagram showing an exemplary data structure created by a paired signal line detection process;

FIG. 7 is a diagram showing an exemplary data structure created by an implication signal line detection process;

FIG. 8 is a diagram showing an exemplary data structure created by a set implication signal line detection process;

DESCRIPTION OF THE PREFERRED EMBODIMENTS

The principles of the present invention will be hereinafter described in detail with reference to the drawings.

Figure 1:
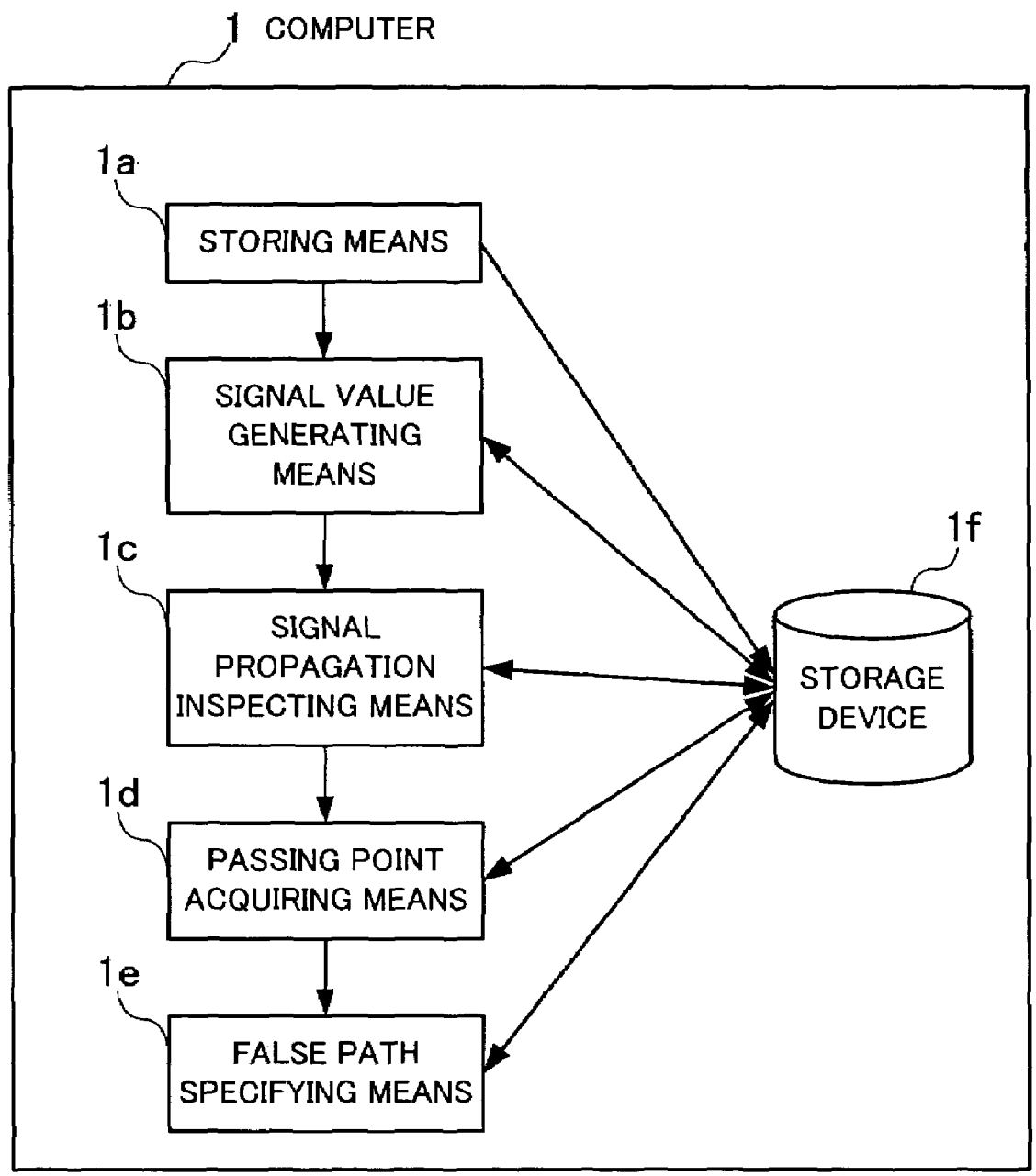
FIG. 1 is a diagram illustrating the principles of the present invention.

FIG. 1 illustrates the principles of the present invention.

As shown in FIG. 1, a computer 1 includes storing means 1a, signal value generating means 1b, signal propagation inspecting means 1c, passing point acquiring means 1d, false path specifying means 1e, and a storage device 1f.

The storing means 1a receives circuit information about a circuit designed by a designer, and stores the circuit information in the storage device 1f. The signal value generating means 1b generates an impossible signal value with respect to a signal line in the designed circuit. The signal propagation inspecting means 1c assigns the signal value generated by the signal value generating means 1b to an input of a gate connected to the signal line with respect to which the signal value has been generated, and then examines whether signal is propagated through the other input of the gate only when accompanied by the signal value. If signal is propagated through the other input of the gate when accompanied by the generated signal value, the passing point acquiring means 1d acquires a passing point of the other signal line connected to the other input of the gate. The false path specifying means 1e specifies a false path by the passing point acquired by the passing point acquiring means 1d.

Thus, instead of detecting each path, the passing point of signal lines constituting a false path is directly detected, whereby the processing time necessary for the false path detection can be shortened. Also, the detected false path is specified by the passing point, thus permitting compact description of the false path.

A first embodiment of the present invention will be now described in detail with reference to the drawings. First, the hardware configuration of a computer for executing a false path detection program according to the present invention will be described.

Figure 2:
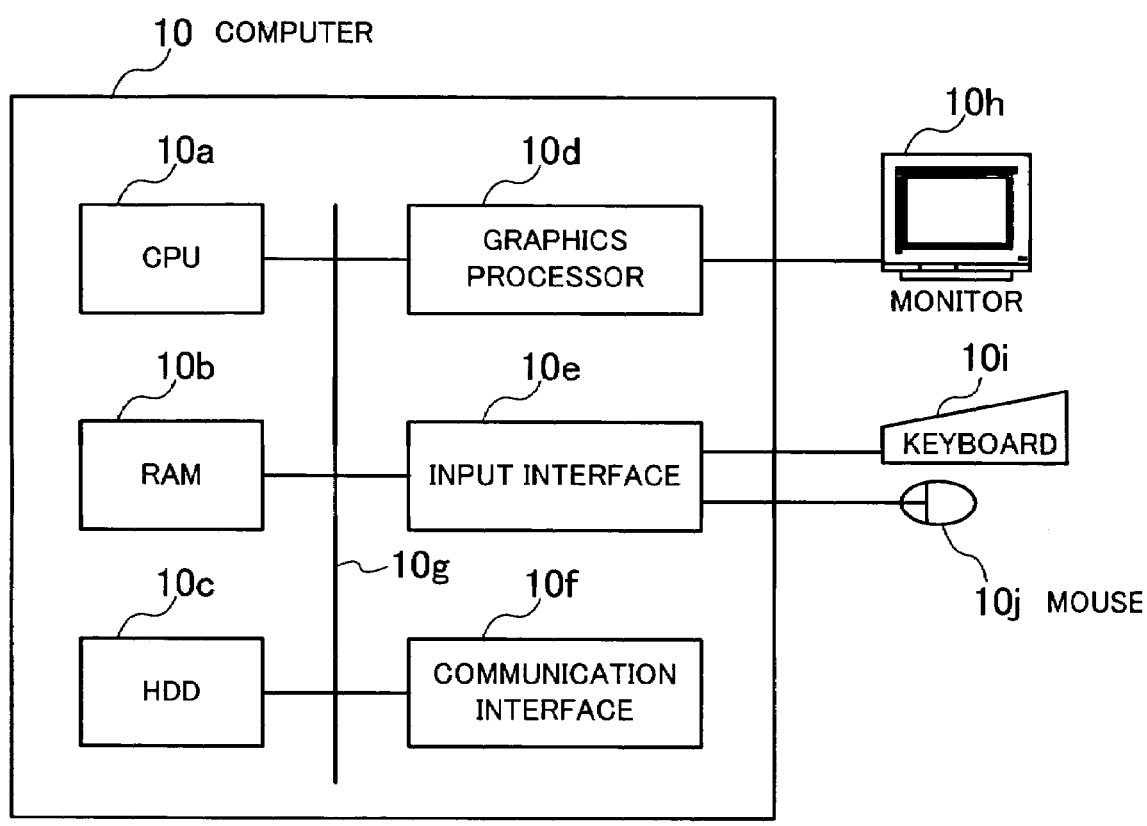
FIG. 2 is a block diagram showing a hardware configuration of a computer according to a first embodiment.

FIG. 2 is a block diagram showing the hardware configuration of a computer according to the first embodiment.

The computer 10 is in its entirety under the control of a CPU (Central Processing Unit) 10a. To the CPU 10a are connected, via a bus 10g, a RAM (Random Access Memory) 10b, a hard disk drive (HDD) 10c, a graphics processor 10d, an input interface 10e, and a communication interface 10f.

The RAM 10b temporarily stores at least part of OS (Operating System) programs and application programs executed by the CPU 10a, the application programs including a CAD program and a false path detection program. Also, the RAM 10b stores various other data necessary for the processing by the CPU 10a. The HDD 10c stores the OS and application programs as well as various data.

The graphics processor 10d is connected with a monitor 10h. In accordance with instructions from the CPU 10a, the graphics processor 10d causes the monitor 10h to display image on a display screen thereof. The input interface 10e is connected with a keyboard 10i and a mouse 10j, and supplies signals from the keyboard 10i and the mouse 10j to the CPU 10a via the bus 10g. The communication interface 10f permits the computer 10 to communicate with other computers, not shown, connected via a network.

The false path detection program is executed by the computer having the hardware configuration described above.

The following describes functions accomplished by the computer 10 when the false path detection program is executed.

Figure 3:
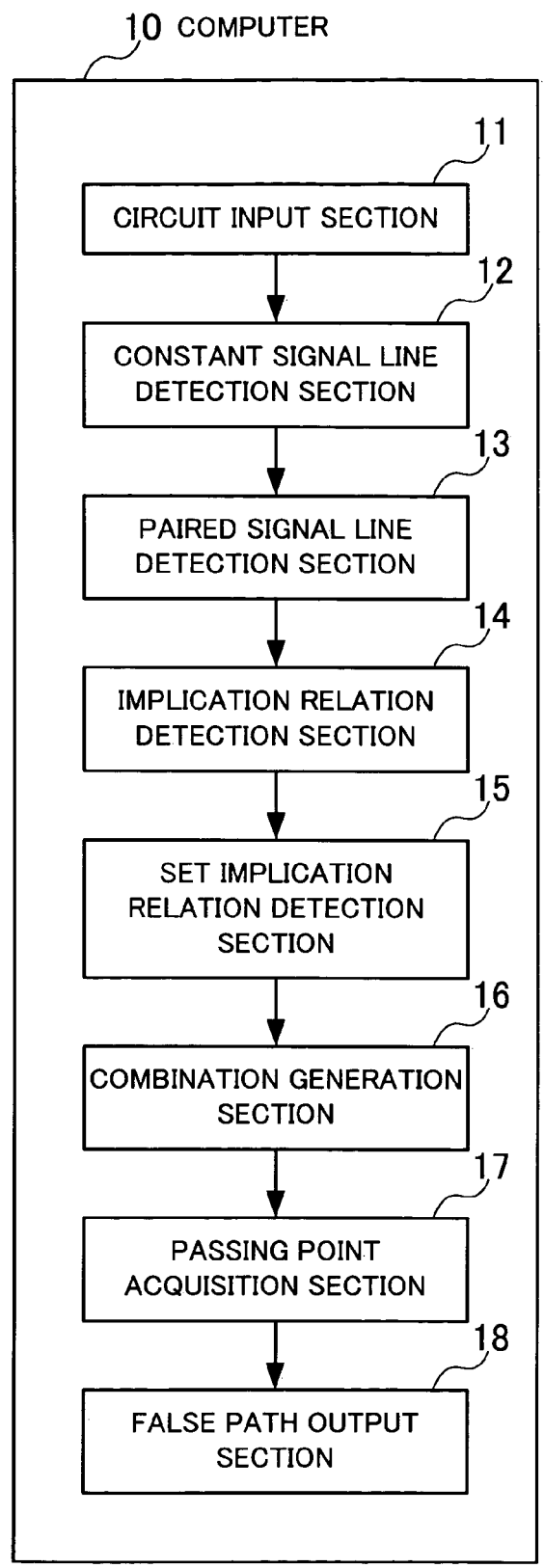
FIG. 3 is a functional block diagram of the computer according to the first embodiment.

FIG. 3 is a functional block diagram of the computer according to the first embodiment.

The computer 10 has functional blocks shown in FIG. 3, which are performed when the false path detection program is executed. Specifically, the computer 10 includes a circuit input section 11, a constant signal line detection section 12, a paired signal line detection section 13, an implication relation detection section 14, a set implication relation detection section 15, a combination generation section 16, a passing point acquisition section 17, and a false path output section 18.

The circuit input section 11 receives circuit information from the designer. The circuit information is information about a circuit designed by the designer and includes, for example, signal lines, circuit elements, identifiers assigned to the input/output terminals of the circuit elements, and relationships of signal line-circuit element connections. The circuit input section 11 stores the received circuit information in, for example, the RAM 10b or the HDD 10c shown in FIG. 2.

Based on the circuit information received from the designer, the constant signal line detection section 12 detects a signal line (constant signal line) to which is input a constant signal (signal which remains only in a constant state). The constant signal is specified by the designer in the case where the designer wishes to perform timing analysis in a certain mode of the circuit, for example.

The paired signal line detection section 13 detects a pair of signal lines (equivalent signal lines) whose signal values are always equal to each other within the circuit, or a pair of signal lines (exclusive signal lines) whose signal values are always different from each other. For example, fan-out signal lines are equivalent signal lines. Also, where an inverter is inserted in a signal line, the input and output sides of the signal line with respect to the inverter are exclusive signal lines.

The implication relation detection section 14 detects signal lines which are in an implication relation. For example, where signal lines satisfy an implication relation such that if the value of one signal line s is a, then the value of the other signal line t is always b (s=a→t=b), such signal lines are detected.

The set implication relation detection section 15 detects a signal line which is in an implication relation with a signal line set having size k (k is a natural number equal to or greater than "2"). For example, where there exists a set implication relation such that if the values of a set of signal lines (s1, s2, ..., sk) are (a1, a2, ..., ak), then the value of a different signal line t is always b ((s1, s2, ..., sk)=(a1, a2, ..., ak)→t=b), the signal line t is detected.

The constant signal line detection section 12, the paired signal line detection section 13, the implication relation detection section 14 and the set implication relation detection section 15 operate in accordance with instructions input by the designer. It is therefore possible to operate only the constant signal line detection section 12 and the paired signal line detection section 13, for example.

The combination generation section 16 generates impossible combinations of signal values with respect to the signal lines detected by the constant signal line detection section 12, paired signal line detection section 13, implication relation detection section 14 and set implication relation detection section 15. Then, the combination generation section 16 outputs the generated signal line value to the detected signal line to apply the generated value to a gate connected to the signal line.

If, with the impossible signal line value input to the signal line connected to the gate, signal is propagated through the other signal line of the gate only when accompanied by the impossible signal line value, the passing point acquisition section 17 acquires a passing point of the other signal line. The passing point of the acquired signal line is represented, for example, by an identifier assigned to the signal line or by the terminal of the gate. The passing point acquisition section 17 then determines whether a path (signal line) passing through the acquired passing point (or connecting between the passing points if the number of acquired passing points is "2" or more) exists or not. The number of passing points to be acquired may be input by the designer so that the passing point acquisition section 17 may acquire passing points not exceeding the specified number.

The expression "signal is propagated" means that the signal is not blocked by the gate. For example, "signal is propagated" if the output of an AND gate, with "1" input to one terminal thereof, varies depending on the input to the other terminal. Signal is "blocked" in a situation where, for example, "0" is input to one terminal of an AND gate and thus the AND gate always outputs a constant value "0" regardless of the input to the other terminal.

If it is judged by the passing point acquisition section 17 that a path exists, the false path output section 18 outputs the passing point as a false path (passing point of false path). The output false path is stored in the RAM 10$b$ or the HDD 10$c$ shown in FIG. 2 or is displayed on the monitor 10$h$, for example. Also, the output path is directly used in the timing analysis. The false path output section 18 is capable of outputting as many false paths as specified by the designer's input operation. In this case, the false path output section 18 outputs false paths in ascending order of the number of passing points.

For a constant signal line detected by the constant signal line detection section 12, the combination generation section 16 generates an impossible value of the constant signal line, that is, a NOT signal which is negation of the constant signal. The combination generation section 16 then inputs the generated impossible value to a gate connected to the constant signal line. If signal is propagated through the other signal line of the gate only when accompanied by the impossible signal line value, the passing point acquisition section 17 acquires a passing point of the other signal line. Then, the passing point acquisition section 17 determines whether a path passing through the acquired passing point exists or not. If it is judged by the passing point acquisition section 17 that a path passing through the passing point exists, the false path output section 18 outputs the passing point as a false path.

Also, for equivalent signal lines or exclusive signal lines detected by the paired signal line detection section 13, the combination generation section 16 generates an impossible combination of signal values of such signal lines. The combination generation section 16 then assigns the generated impossible signal line values to respective inputs of gates connected to the equivalent or exclusive signal lines. If signal is propagated through the other signal lines of the gates which are input with the impossible signal line values, the passing point acquisition section 17 acquires passing points of the other signal lines. Then, the passing point acquisition section 17 determines whether a path connecting between the acquired passing points exists or not. If it is judged by the passing point acquisition section 17 that a path connecting between the passing points exists, the false path output section 18 outputs the passing points as a false path.

For implication-related signal lines detected by the implication relation detection section 14, the combination generation section 16 generates an impossible combination of signal values of such signal lines. The combination generation section 16 then outputs the generated impossible signal line values to gates connected to the implication-related signal lines. If signal is propagated through the other signal lines of the gates only when accompanied by the generated impossible signal line values, the passing point acquisition section 17 acquires passing points of the other signal lines. Then, the passing point acquisition section 17 determines whether a path connecting between the acquired passing points exists or not. If it is judged by the passing point acquisition section 17 that a path connecting between the passing points exists, the false path output section 18 outputs the passing points as a false path.

Also, for implication-related signal lines detected by the set implication relation detection section 15, the combination generation section 16 generates an impossible combination of signal values of such signal lines. The combination generation section 16 then outputs the generated impossible signal line values to gates connected to the implication-related signal lines. If signal is propagated through the other signal lines of the gates which are input with the generated impossible signal line values, the passing point acquisition section 17 acquires passing points of the other signal lines. Then, the passing point acquisition section 17 determines whether a path connecting between the acquired passing points exists or not. If it is judged by the passing point acquisition section 17 that a path connecting between the passing points exists, the false path output section 18 outputs the passing points as a false path.

An exemplary circuit of which the false paths are detected will be now described.

Figure 4:
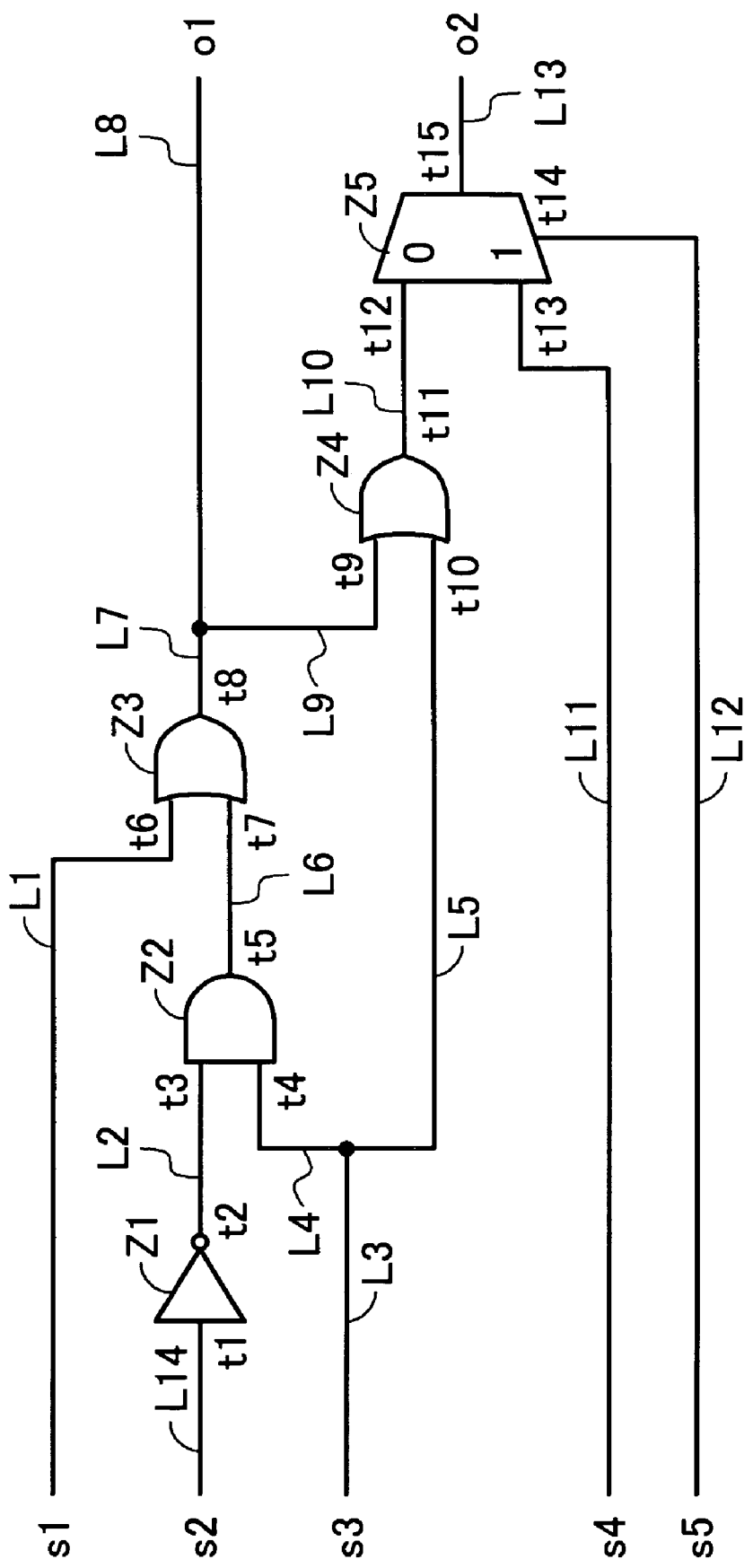
FIG. 4 is a diagram showing an example of circuit which is subjected to false path detection.

FIG. 4 shows an example of circuit which is subjected to the false path detection.

An inverter Z1 has a signal input terminal t1 and a signal output terminal t2. The terminal t1 is connected with a signal line L14 and is input with a signal s2. The inverter Z1 inverts the signal input to the terminal t1 and outputs the inverted signal from the terminal t2.

An AND gate Z2 has signal input terminals t3 and t4 and a signal output terminal t5. The terminal t3 is connected to the terminal t2 of the inverter Z1 by a signal line L2. The AND gate Z2 computes a logical product of the signals input to the terminals t3 and t4, and outputs the result from the terminal t5.

A signal line L3 is input with a signal s3 and connected to signal lines L4 and L5. The signal line L4 is connected to the terminal t4 of the AND gate Z2.

An OR gate Z3 has signal input terminals t6 and t7 and a signal output terminal t8. The terminal t6 is connected with the signal line L1 and thus is input with the signal s1. The terminal t7 is connected to the terminal t5 of the AND gate Z2 by a signal line L6. The terminal t8 is connected with a signal line L7 which is connected to signal lines L8 and L9. The OR gate Z3 computes a logical sum of the signals input to the terminals t6 and t7, and outputs the result to the terminal t8. The signal appearing at the terminal t8 is output to the signal line L8 as a signal o1.

An OR gate Z4 has signal input terminals t9 and t10 and a signal output terminal t11. The terminal t9 is connected with the signal line L9 which is connected to the signal lines L7 and L8. The terminal t10 is connected with the signal line L5 which is connected to the signal lines L3 and L4. The terminal t11 is connected to a signal line L10. The OR gate Z4 computes a logical sum of the signals input to the terminals t9 and t10, and outputs the result from the terminal t11.

A multiplexer Z5 has signal input terminals t12 to t14 and a signal output terminal t15. The terminal t12 is connected with the signal line L10. The terminal t13 is connected with a signal line L11 to which a signal s4 is input, and the terminal t14 is connected with a signal line L12 to which a signal s5 is input. The terminal t15 is connected to a signal line L13. The multiplexer Z5 outputs one of the signals input to the terminals t12 and t13, selected in accordance with the signal s5 input to the terminal t14, to the terminal t15. Specifically, when the signal S5 is "1," the multiplexer Z5 outputs the signal input to the terminal t13 to the terminal t15, and when the signal s5 is "0," the multiplexer Z5 outputs the signal input to the terminal t12 to the terminal t15. The signal appearing at the terminal t15 is output to the signal line L13 as a signal o2.

The designer inputs circuit information about the circuit designed as shown in FIG. 4, for example, signals input to the circuit, types of elements constituting the circuit, input/output terminals of the elements and signal lines connecting the elements, to the computer 10. Based on the input circuit information, the computer 10 detects false paths of the circuit shown in FIG. 4.

Examples of data structures created when the computer 10 executes respective processes will be now described.

FIG. 5 illustrates an exemplary data structure created by a constant signal line detection process.

As shown in FIG. 5, constant signal line data 21 has columns named "CONSTANT SIGNAL LINE," "CONSTANT SIGNAL" and "PASSING POINT OF NODE THROUGH WHICH SIGNAL IS PROPAGATED ONLY WHEN ACCOMPANIED BY IMPOSSIBLE SIGNAL LINE VALUE." The constant signal line data 21 is created in the storage device such as the RAM 10b or the HDD 10c shown in FIG. 2.

Under the column "CONSTANT SIGNAL LINE" is stored the identifier of a signal line (e.g., name or number assigned to the signal line) whose signal line value is constant in the circuit which is subjected to the false path detection. Under the column "CONSTANT SIGNAL" is stored the signal value of the constant signal line. Under the column "PASSING POINT OF NODE THROUGH WHICH . . . " is stored the passing point of a node through which signal is propagated.

The constant signal line and the constant signal are input by the designer and are stored under the columns "CONSTANT SIGNAL LINE" and "CONSTANT SIGNAL," respectively, by the circuit input section 11. The passing point of a node through which signal is propagated is calculated by the constant signal line detection section 12, the combination generation section 16 and the passing point acquisition section 17, and is stored under the column "PASSING POINT OF NODE THROUGH WHICH . . . ."

It is assumed, for example, that in the circuit of FIG. 4, the signal line L12 is a constant signal line and that the constant signal thereof is "0." In this case, the constant signal line detection section 12 detects the signal line L12 as a constant signal line, and the combination generation section 16 generates an impossible value of the signal line L12, that is, a NOT signal "1" which is negation of the constant signal "0." Then, the combination generation section 16 inputs the generated NOT signal "1" to the multiplexer Z5 connected to the signal line L12. The passing point acquisition section 17 detects, as the passing point of a node through which signal is propagated, the terminal t13 of the multiplexer Z5 through which signal is propagated when the NOT signal is input, and stores the detected terminal under the column "PASSING POINT OF NODE THROUGH WHICH . . . " of the constant signal line data 21.

It is not necessary that all of the constant signal line data 21 be stored in the storage device. After one row is processed and a false path corresponding thereto is output, the content of the row may be deleted, whereby the storage area can be saved.

FIG. 6 illustrates an exemplary data structure created by a paired signal line detection process.

As shown in FIG. 6, paired signal line data 22 has a column named "PAIRED SIGNAL LINES" which is subdivided into "NODE 1," "NODE 2" and "PHASE DIFFERENCE," a column named "PASSING POINTS OF NODE PAIR THROUGH WHICH SIGNAL IS PROPAGATED ONLY WHEN ACCOMPANIED BY IMPOSSIBLE SIGNAL LINE VALUE," and a column named "EXISTENCE OF PATH PASSING THROUGH NODE PAIR THROUGH WHICH SIGNAL IS PROPAGATED ONLY WHEN ACCOMPANIED BY IMPOSSIBLE SIGNAL LINE VALUE." The paired signal line data 22 is created in the storage device such as the RAM 10b or the HDD 10c shown in FIG. 2.

Under "NODE 1" and "NODE 2" of the column "PAIRED SIGNAL LINES" are stored the identifiers of signal lines (equivalent signal lines) whose signal values are equal to each other, as well as the identifiers of signal lines (exclusive signal lines) whose signal values are different from each other. Under "PHASE DIFFERENCE" is stored a phase difference between the signals propagated through the signal lines, wherein "0" indicates a phase difference of "0" and "1" indicates a phase difference of π. Under the column "PASSING POINTS OF NODE PAIR THROUGH WHICH . . . " are stored passing points of nodes through which signal is propagated. Under the column "EXISTENCE OF PATH PASSING THROUGH NODE PAIR THROUGH WHICH . . . " is stored information which indicates, by "0" or "1," whether or not a path exists between the passing points of the node pair through which signal is propagated. "0" indicates that no path exists, and "1" indicates that a path exists.

In the example of FIG. 4, the paired signal line detection section 13 detects the signal lines L4 and L5, the signals lines L8 and L9 and the signal lines L8 and L13, each pair as equivalent signal lines, and also detects the signal lines L2 and L14 as exclusive signal lines. The detected signal lines are stored, along with the phase difference between the signal values, under the column "PAIRED SIGNAL LINES" of the paired signal line data 22. The combination generation section 16 generates an impossible combination of signal line values with respect to each pair of equivalent signal lines and exclusive signal lines. For the signal lines L4 and L5, for example, "1" and "0" are generated, respectively. If, with the generated signal line values input to the respective gates, signal is propagated through the other signal lines of the gates, the passing point acquisition section 17 acquires passing points of the other signal lines. For example, the value of the signal line L4 is "1," and accordingly, signal on the signal line L2 is propagated. Also, the value of the signal line L5 is "0," and therefore, signal on the signal line L9 is propagated. Consequently, the terminals t3 and t9 are acquired as the passing points of the node pair through which signal is propagated. If there exists a path passing through the passing points of the signal propagating node pair, the passing point acquisition section 17 stores "1" under the column "EXISTENCE OF PATH PASSING THROUGH NODE PAIR THROUGH WHICH . . . ."

It is not necessary that all of the paired signal line data 22 be stored in the storage device. After one row is processed and a false path corresponding thereto is output, the content of the row may be deleted, whereby the storage area can be saved.

FIG. 7 illustrates an exemplary data structure created by an implication signal line detection process.

As shown in FIG. 7, implication signal line data 23 has a column named "ANTECEDENT OF IMPLICATION" which is subdivided into "NODE" and "VALUE," a column named "CONSEQUENT OF IMPLICATION" which is subdivided into "NODE" and "VALUE," a column named "PASSING POINT OF NODE PAIR THROUGH WHICH SIGNAL IS PROPAGATED ONLY WHEN ACCOMPANIED BY IMPOSSIBLE SIGNAL LINE VALUE," and a column named "EXISTENCE OF PATH PASSING THROUGH NODE PAIR THROUGH WHICH SIGNAL IS PROPAGATED ONLY WHEN ACCOMPANIED BY IMPOSSIBLE SIGNAL LINE VALUE." The implication signal line data 23 is created in the storage device such as the RAM 10b or the HDD 10c shown in FIG. 2.

Under "NODE" of the column "ANTECEDENT OF IMPLICATION" is stored the identifier of a signal line as an antecedent of implication, and under "VALUE" of the column "ANTECEDENT OF IMPLICATION" is stored the signal value of the signal line as the antecedent of implication. Under "NODE" of the column "CONSEQUENT OF IMPLICATION" is stored the identifier of a signal line as a consequent of implication, and under "VALUE" of the column "CONSEQUENT OF IMPLICATION" is stored the signal value that the signal line as the consequent of implication assumes under the condition of the implication antecedent. Under the column "PASSING POINT OF NODE PAIR THROUGH WHICH . . . " is stored the passing point of a node through which signal is propagated. Under the column "EXISTENCE OF PATH PASSING THROUGH NODE PAIR THROUGH WHICH . . . " is stored information which indicates, by "0" or "1," whether or not a path exists between the passing points of the node pair through which signal is propagated. "0" indicates that no path exists, and "1" indicates that a path exists.

For example, in the circuit of FIG. 4, the implication relation detection section 14 detects the implication relation that if the value of the signal line L2 is "0," then the value of the signal line L6 is "0," the detected relation being stored under the columns "ANTECEDENT OF IMPLICATION" and "CONSEQUENT OF IMPLICATION" of the implication signal line data 23. The combination generation section 16 generates an impossible combination of signal line values "0" and "1" with respect to the signal lines L2 and L6, respectively. The passing point acquisition section 17 acquires the terminal t6 through which signal is propagated when accompanied by the generated impossible signal values, and stores the identifier of the terminal under the column "PASSING POINT OF NODE PAIR THROUGH WHICH . . . ." Since there is no path between the terminals t4 and t6, the passing point acquisition section 17 judges that a path connecting the node pair through which signal is propagated does not exist and thus stores "0" under the column "EXISTENCE OF PATH PASSING THROUGH NODE PAIR THROUGH WHICH . . . " of the implication signal line data 23.

It is not necessary that all of the implication signal line data 23 be stored in the storage device. After one row is processed and a false path corresponding thereto is output, the content of the row may be deleted, whereby the storage area can be saved.

FIG. 8 illustrates an exemplary data structure created by a set implication signal line detection process.

As shown in FIG. 8, set implication signal line data 24 has a column named "ANTECEDENT OF IMPLICATION," a column named "CONSEQUENT OF IMPLICATION" which is subdivided into "NODE" and "VALUE," a column named "NODE SET THROUGH WHICH SIGNAL IS PROPAGATED ONLY WHEN ACCOMPANIED BY IMPOSSIBLE SIGNAL LINE VALUE," and a column named "EXISTENCE OF PATH PASSING THROUGH NODE SET THROUGH WHICH SIGNAL IS PROPAGATED ONLY WHEN ACCOMPANIED BY IMPOSSIBLE SIGNAL LINE VALUE." The set implication signal line data 24 is created in the storage device such as the RAM 10b or the HDD 10c shown in FIG. 2.

Under the column "ANTECEDENT OF IMPLICATION" are stored the identifiers of signal lines as an antecedent of set implication. Under "NODE" of the column "CONSEQUENT OF IMPLICATION" is stored the identifier of a signal line as a consequent of implication, and under "VALUE" of the column "CONSEQUENT OF IMPLICATION" is stored the signal value that the signal line as the consequent of implication assumes under the condition of the implication antecedent. Under the column "NODE SET THROUGH WHICH . . . " is stored the passing points of nodes through which signal is propagated. Under the column "EXISTENCE OF PATH PASSING THROUGH NODE SET THROUGH WHICH . . . " is stored information which indicates, by "0" or "1," whether or not a path exists between the passing points through which signal is propagated. "0" indicates that no path exists, and "1" indicates that a path exists.

In the example of FIG. 4, the set implication relation detection section 15 detects an implication relation that holds between a signal line set with size k and a certain signal line, the detected implication relation being stored under the columns "ANTECEDENT OF IMPLICATION" and "CONSEQUENT OF IMPLICATION" of the set implication signal line data 24. The combination generation section 16 generates an impossible combination of signal line values with respect to the detected implication relation. If, with the generated signal line values input to gates, signal is propagated through the other signal lines of the gates, the passing point acquisition section 17 acquires passing points of the other signal lines and stores the identifiers of the acquired passing points under the column "NODE SET THROUGH WHICH . . . " of the set implication signal line data 24. Then, if there is a path between the passing points of the node set through which signal is propagated, the passing point acquisition section 17 stores "1" under the column "EXISTENCE OF PATH PASSING THROUGH NODE SET THROUGH WHICH . . . " of the set implication signal line data 24.

It is not necessary that all of the set implication signal line data 24 be stored in the storage device. After one row is processed and a false path corresponding thereto is output, the content of the row may be deleted, whereby the storage area can be saved.

In the following, operations of the sections shown in the functional block diagram of FIG. 3 will be described.

Figure 9:
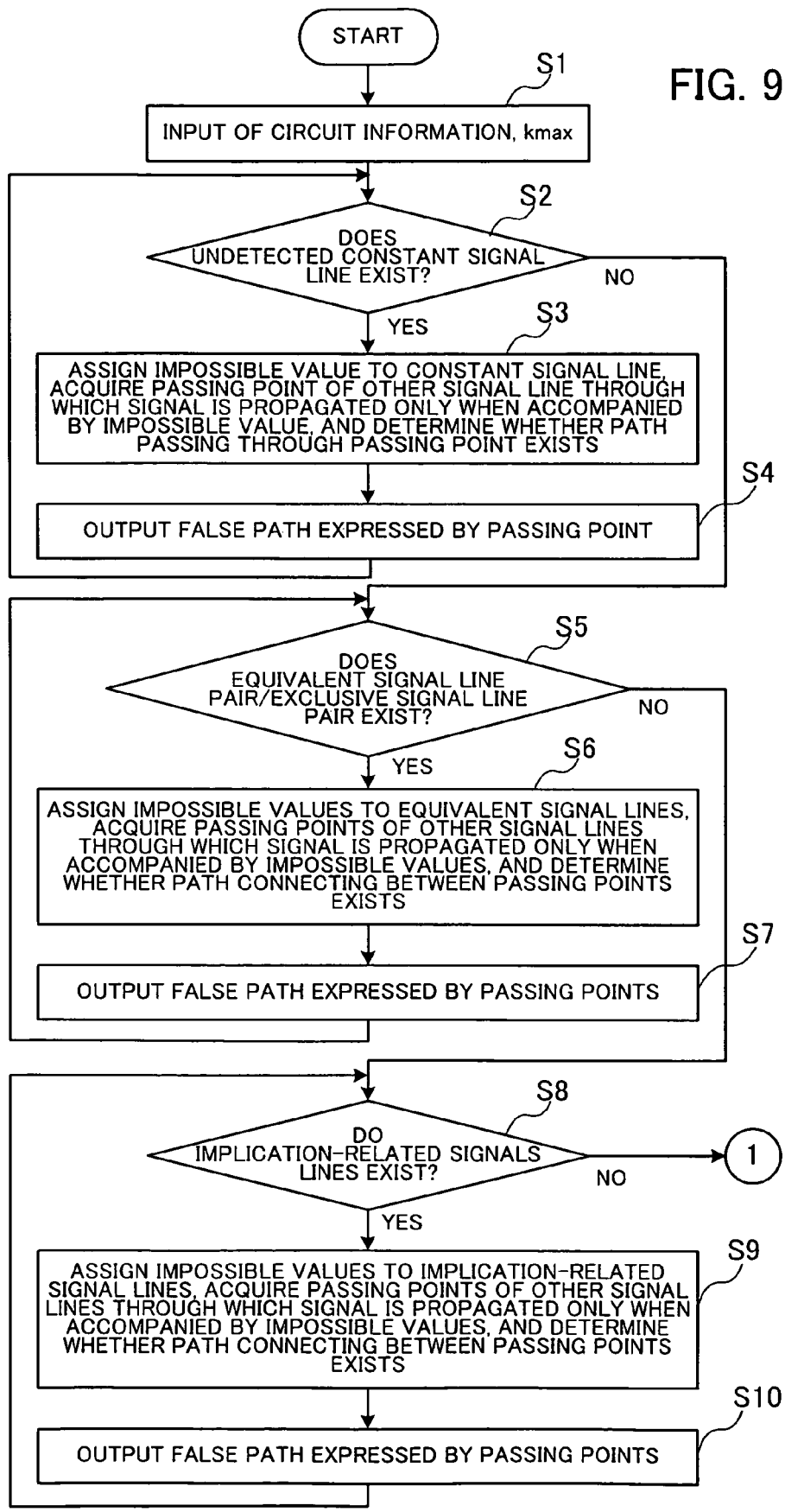
FIG. 9 is part of a flowchart showing a flow of process illustrated in the functional block diagram of FIG. 3.
Figure 10:
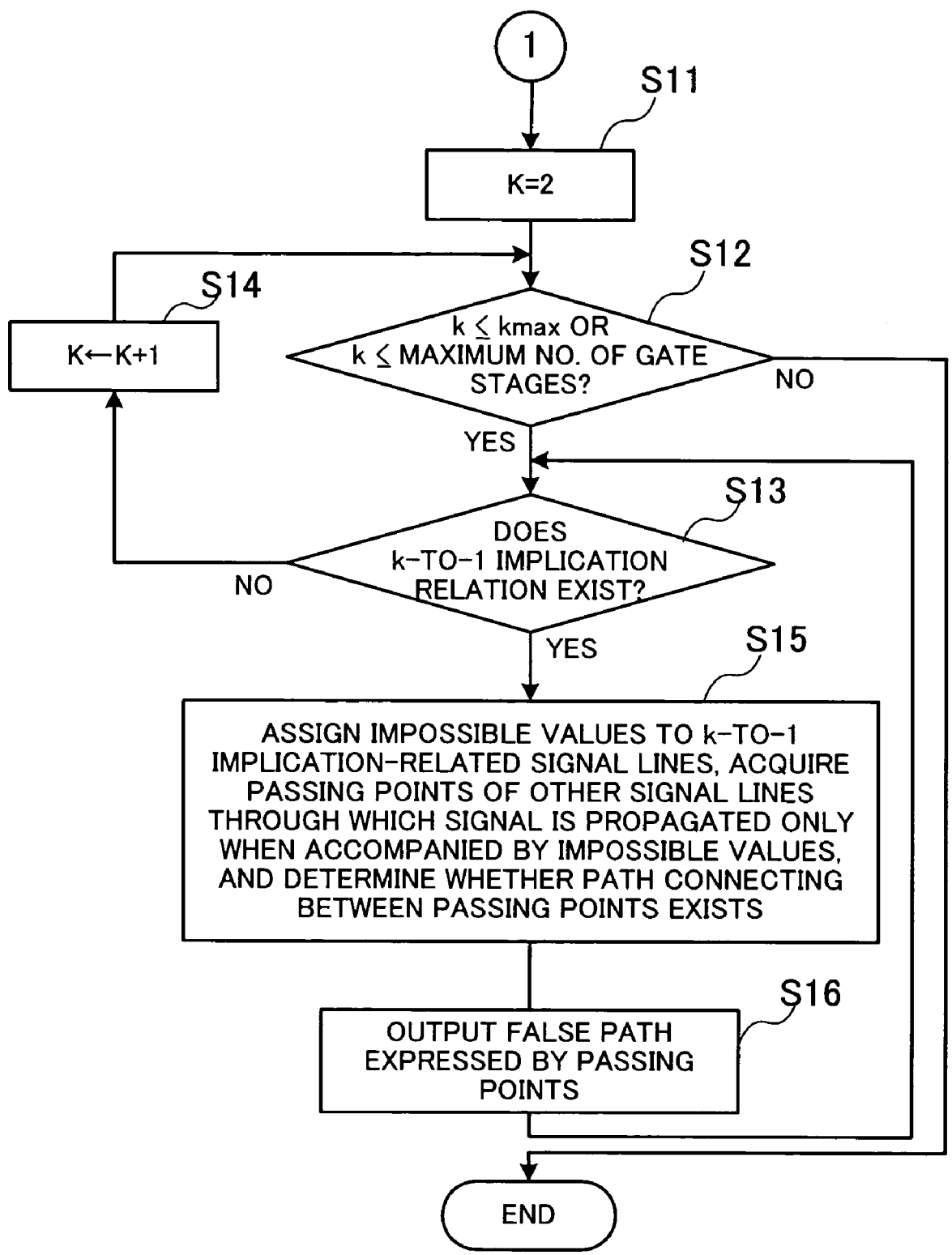
FIG. 10 is the remaining part of the flowchart showing the flow of process illustrated in the functional block diagram of FIG. 3.

A flowchart of FIGS. 9 and 10 illustrates a flow of process shown in the functional block diagram of FIG. 3.

First, the flowchart will be outlined. It is assumed that the exemplary circuit shown in FIG. 4 is a target of false path detection. In Step S1, circuit information on the circuit as a target of false path detection and a maximum value kmax of k in k-to-1 implication relation, used in Step S12, are input. Input of kmax may be omitted.

In Steps S2 to S4, false path detection is performed with respect to combinations of signal line values having the smallest number of elements, that is, 1, among impossible combinations of signal line values. Namely, false paths are detected with respect to constant signal lines. With the impossible signal line value applied to a gate connected to the signal line, a false path is specified and output by means of the passing point of the other signal line connected to the gate.

In Steps S5 to S10, false path detection is performed with respect to combinations of signal line values having the second smallest number of elements, that is, 2, among impossible combinations of signal line values. Namely, false paths are detected with respect to pairs of signal lines. Such pairs of signal lines fall under three types of relation, that is, equivalence relation, exclusion relation which is negation of equivalence relation, and implication relation. For the equivalence and exclusion relations, false path detection is performed in Steps S5 to S7, and for the implication relation, false path detection is performed in Steps S8 to S10.

In Steps S11 to S16, false path detection is performed with respect to combinations of signal line values having three or more elements among impossible combinations of signal line values. Namely, false path detection is performed with respect to set implication relations. In this case, with the number of elements increased one by one, false path detection is performed with respect to k (k≧2)-to-1 implication relations.

The flowchart will be now described in detail. The process shown in the functional block diagram of FIG. 3 is carried out by executing the following steps.

In Step S1, the circuit input section 11 accepts the circuit information and kmax input by the designer. It is assumed that in the input circuit information, the signal s5 input to the signal line L12 shown in FIG. 4 is previously fixed at the constant "0."

In Step S2, the constant signal line detection section 12 determines whether or not there exists an undetected constant signal line in the circuit of FIG. 4. If there is an undetected constant signal line, the flow proceeds to Step S3; if there is no undetected constant signal line, the flow proceeds to Step S5.

In Step S3, the combination generation section 16 generates an impossible signal value of the constant signal line detected by the constant signal line detection section 12, and outputs the generated signal value to a gate connected to the constant signal line. If, with the generated signal value output to the gate, signal is propagated through the other signal line of the gate, the passing point acquisition section 17 acquires a passing point of the other signal line. Then, the passing point acquisition section 17 determines whether a path passing through the passing point exists or not.

For example, the circuit information input in Step S1 indicates that the signal line L12 in FIG. 4 is a constant signal line with the constant "0." Accordingly, the constant signal line detection section 12 detects the signal line L12 as a constant signal line. The combination generation section 16 generates "1," which is negation of the constant "0," as an impossible signal line value of the signal line L12, and outputs the generated value to the terminal t14 of the multiplexer Z5. At this time, signal on a different signal line L11 connected to the multiplexer Z5 is propagated. Accordingly, the passing point acquisition section 17 acquires, as a passing point, the terminal t13 connected with the signal line L11. The path passing through the terminal t13 is a logical false path. In the case where conventional false path detection is additionally performed taking account of delay, the delay relationship between the terminals t13 and t14 is examined to determine whether the path is really a false path or not.

If it is judged by the passing point acquisition section 17 that a path passing through the passing point exists, the false path output section 18 outputs the passing point as a set of false paths, in Step S4. In the above example, the false path set is expressed as {t13} by using the terminal t13 which is the passing point of the signal line L11. The number of false path-specifying passing points output in Step S4 invariably takes a minimum value of "1." The constant signal line detection section 12 detects, in addition to the constant signal lines specified as explained above, constant signal lines which are identified with a specified constant value propagated, and constant signal lines which always assume the constant "0" because of the operation of the circuit.

In Step S5, the paired signal line detection section 13 detects a pair of equivalent/exclusive signal lines. If such a pair is detected, the flow proceeds to Step S6; if no such pair is detected, the flow proceeds to Step S8.

In Step S6, the combination generation section 16 generates an impossible combination of signal line values with respect to the detected pair of equivalent/exclusive signal lines. Then, the combination generation section 16 outputs the generated impossible combination of signal line values to gates connected to the equivalent/exclusive signal line pair. If, with the impossible signal line values output to the gates, signal is propagated through the other signal lines of the gates, the passing point acquisition section 17 acquires passing points of the other signal lines. Then, the passing point acquisition section 17 determines whether or not a path exists between the acquired passing points.

In the circuit of FIG. 4, for example, the signal lines L4 and L5, which are fan-outs of the signal line L3, constitute an equivalent signal line pair. Where a constant value is propagated through the signal line L3, the impossible combination of signal line values for this equivalence relation is the combination: signal on the signal line L4≠signal on the signal line L5. A gate which is connected to the signal line L4 as an input thereof is the AND gate Z2, and a gate which is connected to the signal line L5 as an input thereof is the OR gate Z4. The non-controlling value of the AND gate Z2 is "0" and the non-controlling value of the OR gate Z4 is "1." Thus, "1" and "0" are set, respectively, as impossible signal values of the signal lines L4 and L5 through which signal is input to the terminals t4 and t10 of the AND gate Z2 and the OR gate Z4, respectively, and the other terminal t3 than the terminal t4 of the AND gate Z2 and the other terminal t9 than the terminal t10 of the OR gate. Z4 are acquired as passing points. A path, if exists between the terminals t3 and t9, is a logical false path. Examining whether a path exists between the output terminal t2 of the inverter Z1 and the input terminal t9 of the OR gate Z4 reveals that there exists a path constituted by the signal lines L2, L6, L7 and L9.

If it is judged by the passing point acquisition section 17 that a path connecting between the passing points exists, the false path output section 18 outputs the passing points as a set of false paths, in Step S7. In the above example, the false path set is expressed as {t3, t9} by using the terminals t3 and t9 which are the passing points of the signal lines L2 and L9. Thus, the path set passing through the passing points {t3, t9} is a logical false path. In the case where additional false path analysis is performed taking account of delay, the delay relationship between the terminals t3 and t4 and between the terminals t9 and t10 is examined to determine whether the path is really a false path or not. The number of false path-specifying passing points output in Step S7 invariably takes a value of "2."

In Step S8, the implication relation detection section 14 detects signal lines which are in an implication relation. If such signal lines are detected, the flow proceeds to Step S9; if no such signal lines are detected, the flow proceeds to Step S11.

In Step S9, the combination generation section 16 generates an impossible combination of signal line values with respect to the detected implication-related signal lines. Then, the combination generation section 16 outputs the generated impossible signal line values to gates connected to the implication-related signal lines. If signal is propagated through the other signal lines connected to the gates, the passing point acquisition section 17 acquires passing points of the other signal lines. Then, the passing point acquisition section 17 determines whether a path connecting between the acquired passing points exists or not.

In the circuit of FIG. 4, for example, there is an implication relation that if the signal line L2=0, then the signal line L6=0. In this implication relation, an impossible combination of the signal line values is (L2, L6)=(0, 1), and the passing point of a signal line through which signal is propagated is the terminal t6. No path exists between the input terminal t4 of the AND gate Z2, which is a passing point of the signal line paired with the signal line L2, and the input terminal t6 of the OR gate Z3, which is a passing point of the signal line paired with the signal line L6.

If it is judged by the passing point acquisition section 17 that a path connecting between the passing points exists, the false path output section 18 outputs the passing points as a set of false paths, in Step S10. In the above example, since there is no path between the passing points, no false path set is output.

In Step S11, the set implication relation detection section 15 substitutes "2" for the variable k. The value substituted for the variable k can be changed by the user.

In Step S12, the set implication relation detection section 15 determines whether either of the following two conditions is fulfilled or not, that is, the condition that the variable k is smaller than or equal to kmax and the condition that the variable k is smaller than or equal to a maximum number of gate stages. If the variable k is smaller than or equal to kmax or the maximum number of gate stages, the flow proceeds to Step S13; if the variable k is greater than kmax and the maximum number of gate stages, the process is ended.

In Step S13, the set implication relation detection section 15 determines whether or not there exist undetected signal lines which are in k-to-1 implication relation. If there is no undetected implication relation, the flow proceeds to Step S14; if there exists an undetected implication relation, the flow proceeds to Step S15. Where k=2, for example, the relation in the circuit of FIG. 4 that if L1=1 and L12=0, then L13=1 is detected as k-to-1 implication relation. Then, in Steps S15 and S16 similar to Steps S9 and S10 explained above, a false path associated with the implication relation is detected and output.

In Step S14, the set implication relation detection section 15 adds "1" to the variable k.

In Step S15, the combination generation section 16 generates an impossible combination of signal line values with respect to the detected implication-related signal lines. Then, the combination generation section 16 assigns the generated impossible signal line values to inputs of gates connected to the implication-related signal lines. If signal is propagated through the other signal lines connected to the gates only when the generated values are input, passing points of the other signal lines are acquired. The passing point acquisition section 17 then determines whether a path connecting between the acquired passing points exists or not.

If it is judged by the passing point acquisition section 17 that a path connecting between the passing points exists, the false path output section 18 outputs the passing points as a set of false paths, in Step S16.

In the flowchart shown in FIGS. 9 and 10, only Steps S2 to S4, only Steps S5 to S7, only Steps SB to S10, or only Steps S11 to S16 can be executed, though not illustrated as such. Also, Steps S2 to S4, Steps S5 to S7, Steps S8 to S10, and Steps S11 to S16 can be selectively executed in accordance with instructions from the designer. Further, it is possible to output as many false paths as specified by the designer's input operation.

Thus, impossible combinations of signal line values in the circuit are generated by the constant signal line detection section 12, the paired signal line detection section 13, the implication relation detection section 14 and the set implication relation detection section 15. Since a plurality of paths can be simultaneously detected without regard to delay values, it is possible to prevent explosion of computation time from being caused due to the counting of paths or delay values.

Also, false paths are specified by the passing points of signal lines, and this makes it possible to describe false paths compactly.

In the case where false path analysis is performed while counting up input vectors, it is necessary that the analysis be performed on each of $2^n$ (n: natural number) input vectors. If the analysis is performed with respect to a smaller number of input vectors only, circuit delay is underestimated because the analysis performed does not cover the circuit operation in full. According to the present invention, by increasing/decreasing the number of impossible combinations of signal values or the number of elements in such combinations, it is possible to flexibly vary the detection capability without entailing underestimation of circuit delay.

Also, the constant signal line detection section 12, the paired signal line detection section 13, the implication relation detection section 14 and the set implication relation detection section 15 are activated in this order so that impossible combinations of signal line values in the circuit may be generated in ascending order of the number of elements in such combinations. Accordingly, false paths can be detected and output in ascending order of the number of false path-specifying passing points. The number of passing points can exert an exponential influence on the processing speed of a timing optimization system or timing analysis system that utilizes false paths. According to the invention, false paths can be generated in a manner convenient for such systems utilizing false paths. Further, by externally specifying the number of false paths to be generated, it is possible to generate most convenient sets of false paths not exceeding the specified number.

A second embodiment of the present invention will be now described in detail with reference to the drawings. A computer according to the second embodiment can also be used for compressing the description amount of false paths specified by passing points. The computer accepts false paths described by passing points, and performs a process similar to that shown in the flowchart of FIGS. 9 and 10, with respect only to the signal lines associated with the passing points. Then, the computer outputs a false path description which is smaller in description amount than the input false path description.

Figure 11:
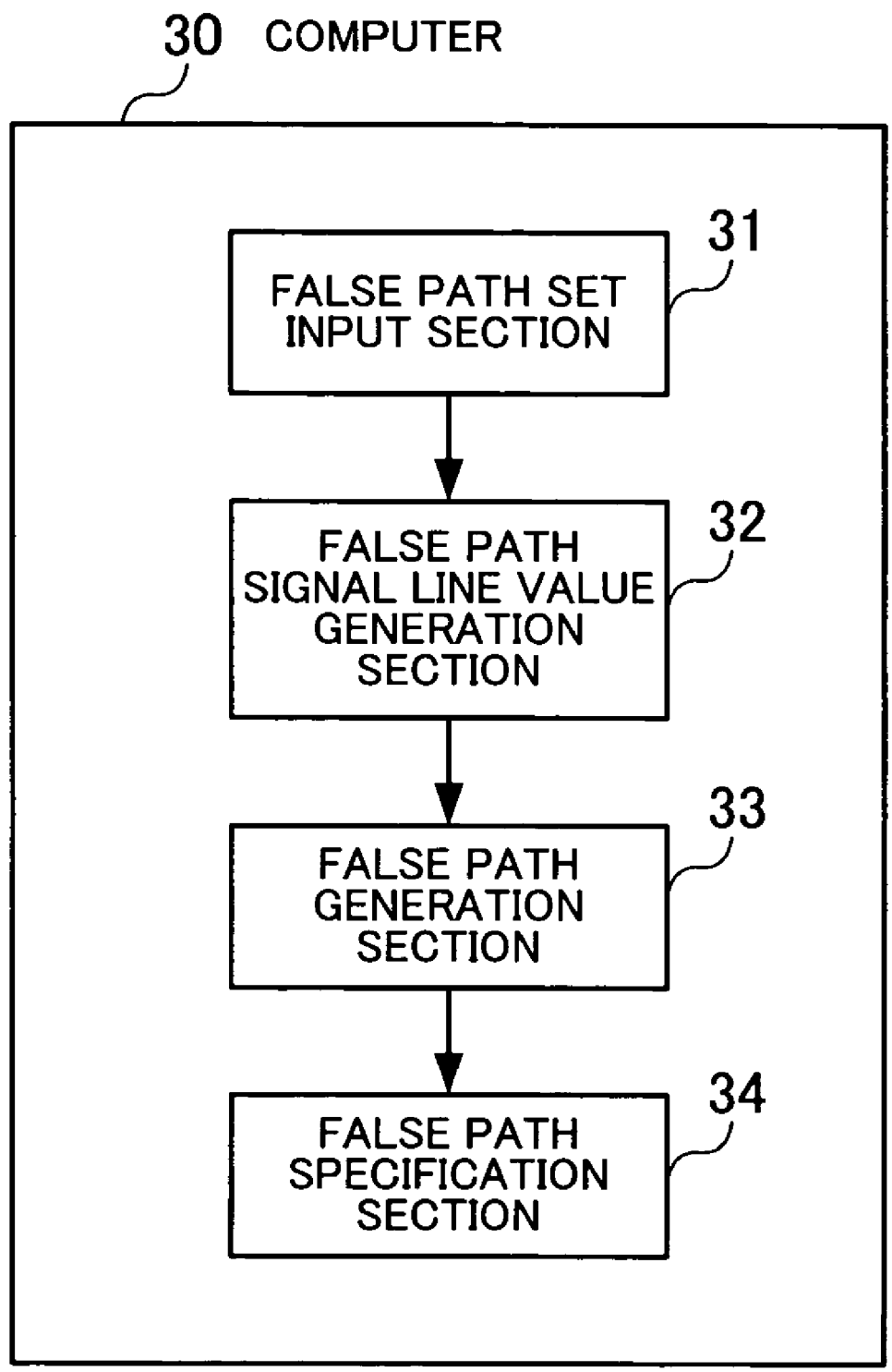
FIG. 11 is a functional block diagram of a computer according to a second embodiment.

FIG. 11 is a functional block diagram of the computer according to the second embodiment.

As shown in FIG. 11, the computer 30 has a false path set input section 31, a false path signal line value generation section 32, a false path generation section 33, and a false path specification section 34.

The false path set input section 31 accepts, from the designer, a false path description specified by passing points.

Only with respect to signal lines which the false paths specified by passing points pass through, the false path signal line value generation section 32 generates impossible combinations of signal line values in ascending order of the number of elements in such combinations.

The false path generation section 33 generates false paths corresponding to the impossible combinations of signal line values.

The false path specification section 34 outputs the false paths which are each specified by the number of passing points equal to the number of elements in the combination of signal line values.

In the second embodiment, the computer 30 is input with a false path description specified by passing points, instead of the circuit information. Namely, in Step S1 of the flowchart shown in FIGS. 9 and 10, a false path description specified by passing points is input. Then, a process similar to that of the first embodiment is performed with respect to signal lines associated with the input false path. Let it be assumed, for example, that in the circuit of FIG. 4, a false path is specified by the passing points $\{t1, t2, t3, t5, t7, t8, t9, t11, t12, t15\}$. The false path is input to the computer 30, whereupon false path detection is performed only within the signal lines and a false path description $\{t3, t9\}$, which is a compressed description of passing points, is output.

In this manner, signal lines associated with a false path are specified by passing points, and false path detection is performed with respect to the signal lines. Consequently, the input false path description is output in compressed form, making it possible to more specifically locate false paths in the circuit.

According to the false path detection program of the present invention, impossible signal values are generated with respect to signal lines in the designed circuit, and the passing points of signal lines constituting false paths are directly detected, whereby the processing time necessary for the false path detection can be shortened. Also, false paths are specified by passing points, and this makes it possible to describe false paths compactly.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A computer-readable medium having a false path detection program for detecting false paths of a designed circuit, wherein said false path detection program causes a computer to perform the steps comprising:
   receiving circuit information about the circuit and storing the circuit information in a storage device;
   generating an impossible signal value with respect to a signal line in the circuit;
   assigning the generated impossible signal value to an input of a gate connected to the signal line and examining whether a signal on the signal line is propagated through another signal line of the gate only when accompanied by the impossible signal value;
   acquiring a passing point of the other signal line connected to the other input of the gate if signal is propagated; and
   specifying a false path by the passing point;
   wherein said impossible signal value generating step includes:
   generating a signal value on the basis of a constant signal applied to the signal line;
   generating signal values on the basis of equivalent signals applied to equivalent signal lines in the circuit or exclusive signals applied to exclusive signal lines in the circuit;
   generating signal values on the basis of implication signals applied to signal lines having an implication relation; and
   controlling generation of the signal values such that the signal values are generated by said signal value generating steps on the basis of the constant signal, the equivalent signals and the implication signals, in order mentioned.

2. The false path detection program according to claim 1, wherein the constant signal is externally specified.

3. A computer-readable medium having a false path detection program for detecting false paths of a designed circuit, wherein said false path detection program causes a computer to perform the steps comprising: receiving circuit information about the circuit and storing the circuit information in a storage device; generating an impossible signal value with respect to a signal line in the circuit; assigning the generated impossible signal value to an input of a gate connected to the signal line and examining whether a signal on the signal line is propagated through another signal line of the gate only when accompanied by the impossible signal value; acquiring a passing point of the other signal line connected to the other input of the gate if signal is propagated; and specifying a false path by the passing point; wherein the number of passing points to be acquired is externally specified, and said passing point acquiring step acquires passing points not exceeding the specified number; and wherein said impossible signal value generating step includes: generating signal value on the basis of a constant signal applied to the signal line; generating signal values on the basis of equivalent signals applied to equivalent signal lines in the circuit or exclusive signals applied to exclusive signal lines in the circuit; generating signal values on the basis of implication signals applied to the signal lines having an implication relation; and controlling generation of the signal values such that the signal values are generated by said signal value generating steps on the basis of the constant signal, the equivalent signals and the implication signals, in order mentioned.

4. A computer-readable medium having a false path detection program for detecting false paths of a designed circuit, wherein said false path detection program causes a computer to perform the steps comprising: receiving circuit information about the circuit and storing the circuit information in a storage device; generating an impossible signal value with respect to a signal line in the circuit; assigning the generated impossible signal value to an input of a gate connected to the signal line and examining whether a signal on the signal line is propagated through another signal line of the gate only when accompanied by the impossible signal value; acquiring a passing point of the other signal line connected to the other input of the gate if signal is propagated; and specifying a false path by the passing point; wherein the number of false paths to be output is externally specified, and the false paths are output in ascending order of the number of passing points; and wherein said impossible signal value generating step includes: generating signal value on the basis of a constant signal applied to the signal line; generating signal values on the basis of equivalent signals applied to equivalent signal lines in the circuit or exclusive signals applied to exclusive signal lines in the circuit; generating signal values on the basis of implication signals applied to the signal lines having an implication relation; and controlling generation of the signal values such that the signal values are generated by said signal value generating steps on the basis of the constant signal, the equivalent signals and the implication signals, in order mentioned.

5. A false path detection device for detecting false paths of a designed circuit, comprising:

signal value generating means for generating an impossible signal value with respect to a signal line in the circuit;

signal propagation inspecting means for assigning the generated impossible signal value to an input of a gate connected to the signal line and examining whether a signal on the signal line is propagated through another signal line of the gate only when accompanied by the impossible signal value;

passing point acquiring means for acquiring a passing point of the other signal line connected to the other input of the gate if signal is propagated; and false path specifying means for specifying a false path by the passing point;

wherein said signal value generating means includes:

signal generation means for generating a signal value on the basis of a constant signal applied to the signal line;

paired signal generation means for generating signal values on the basis of equivalent signals applied to equivalent signal lines in the circuit or exclusive signals applied to exclusive signal lines in the circuit;

implication signal generation means for generating signal values on the basis of implication signals applied to signal lines having an implication relation; and generation control means for controlling generation of the signal values such that the signal values are generated by said signal generation means, said paired signal generation means and said implication signal generation means in order mentioned.

6. The false path detection device according to claim 5, wherein the constant signal is externally specified.

7. A false path detection device for detecting false paths of a designed circuit, comprising: signal value generating means for generating an impossible signal value with respect to a signal line in the circuit; signal propagation inspecting means for assigning the generated impossible signal value to an input of a gate connected to the signal line and examining whether a signal on the signal line is propagated through another signal line of the gate only when accompanied by the impossible signal value; passing point acquiring means for acquiring a passing point of the other signal line connected to the other input of the gate if signal is propagated; and false path specifying means for specifying a false path by the passing point; wherein the number of passing points to be acquired is externally specified, and said passing point acquiring means acquires passing points not exceeding the specified number; and wherein said impossible signal value generating means includes: signal generating means for generating a signal value on the basis of a constant signal applied to the signal line; paired signal generation means for generating signal values on the basis of equivalent signals applied to equivalent signal lines in the circuit or exclusive signals applied to exclusive signal lines in the circuit; implication signal generation means for generating signal values on the basis of implication signals applied to the signal lines having an implication relation; and generation control means for controlling generation of the signal values such that the signal values are generated by said signal generating means, said paired signal generation means and said implication signal generation means in order mentioned.

8. A false path detection device for detecting false paths of a designed circuit, comprising: signal value generating means for generating an impossible signal value with respect to a signal line in the circuit; signal propagation inspecting means for assigning the generated impossible signal value to an input of a gate connected to the signal line and examining whether a signal on the signal line is propagated through another signal line of the gate only when accompanied by the impossible signal value; passing point acquiring means for acquiring a passing point of the other signal line connected to the other input of the gate if signal is propagated; and false path specifying means for specifying a false path by the passing point; wherein the number of false paths to be output is externally specified, and the false paths are output in ascending order of the number of passing points; and wherein said impossible signal value generating means includes: signal generating means for generating a signal value on the basis of a constant signal applied to the signal line; paired signal generation means for generating signal values on the basis of equivalent signals applied to equivalent signal lines in the circuit or exclusive signals applied to exclusive signal lines in the circuit; implication signal generation means for generating signal values on the basis of implication signals applied to the signal lines having an implication relation; and generation control means for controlling generation of the signal values such that the signal values are generated by said signal generating means, said paired signal generation means and said implication signal generation means in order mentioned.

9. A false path detection method for detecting false paths of a designed circuit by a computer, comprising the steps of:

receiving circuit information about the circuit and storing the circuit information in a storage device by storing means;

generating an impossible signal value with respect to a signal line in the circuit by signal value generating means;

assigning the generated impossible signal value to an input of a gate connected to the signal line and examining, by signal propagation inspecting means, whether a signal on the signal line is propagated through another signal line of the gate only when accompanied by the impossible signal value;

acquiring a passing point of the other signal line connected to the other input of the gate by passing point acquiring means if signal is propagated; and specifying, by false path specifying means, a false path by means of the passing point;

wherein said signal value generating means includes:

signal generation means for generating a signal value on the basis of a constant signal applied to the signal line;

paired signal generation means for generating signal values on the basis of equivalent signals applied to equivalent signal lines in the circuit or exclusive signals applied to exclusive signal lines in the circuit;

implication signal generation means for generating signal values on the basis of implication signals applied to signal lines having an implication relation; and generation control means for controlling generation of the signal values such that the signal values are generated by said signal generation means, said paired signal generation means and said implication signal generation means in order mentioned.

10. The false path detection method according to claim 9, wherein the constant signal is externally specified.

11. A false path detection method for detecting false paths of a designed circuit by a computer, comprising the steps of: receiving circuit information about the circuit and storing the circuit information in a storage device by storing means; generating an impossible signal value with respect to a signal line in the circuit by signal value generating means; assigning the generated impossible signal value to an input of a gate connected to the signal line and examining, by signal propagation inspecting means, whether a signal on the signal line is propagated through another signal line of the gate only when accompanied by the impossible signal value; acquiring a passing point of the other signal line connected to the other input of the gate by passing point acquiring means if signal is propagated; and specifying, by false path specifying means, a false path by means of the passing point; wherein the number of passing points to be acquired is externally specified, and said passing point acquiring means acquires passing points not exceeding the specified number; and wherein said impossible signal value generating means includes: signal generating means for generating a signal value on the basis of a constant signal applied to the signal line; paired signal generation means for generating signal values on the basis of equivalent signals applied to equivalent signal lines in the circuit or exclusive signals applied to exclusive signal lines in the circuit; implication signal generation means for generating signal values on the basis of implication signals applied to the signal lines having an implication relation; and generation control means for controlling generation of the signal values such that the signal values are generated by said signal generating means, said paired signal generation means and said implication signal generation means in order mentioned.

12. A false path detection method for detecting false paths of a designed circuit by a computer, comprising the steps of: receiving circuit information about the circuit and storing the circuit information in a storage device by storing means; generating an impossible signal value with respect to a signal line in the circuit by signal value generating means; assigning the generated impossible signal value to an input of a gate connected to the signal line and examining, by signal propagation inspecting means, whether a signal on the signal line is propagated through another signal line of the gate only when accompanied by the impossible signal value; acquiring a passing point of the other signal line connected to the other input of the gate by passing point acquiring means if signal is propagated; and specifying, by false path specifying means, a false path by means of the passing point; wherein the number of false paths to be output is externally specified, and the false paths are output in ascending order of the number of passing point; and wherein said impossible signal value generating means includes: signal generating means for generating a signal value on the basis of a constant signal applied to the signal line; paired signal generation means for generating signal values on the basis of equivalent signals applied to equivalent signal lines in the circuit or exclusive signals applied to exclusive signal lines in the circuit; implication signal generation means for generating signal values on the basis of implication signals applied to the signal lines having an implication relation; and generation control means for controlling generation of the signal values such that the signal values are generated by said signal generating means, said paired signal generation means and said implication signal generation means in order mentioned.

* * * * *

UNITED STATES PATENT AND TRADEMARK OFFICE
CERTIFICATE OF CORRECTION

PATENT NO. : 7,398,424 B2
APPLICATION NO. : 10/827690
DATED : July 8, 2008
INVENTOR(S) : Higuchi It is certified that error appears in the above-identified patent and that said Letters Patent is hereby corrected as shown below:

On the title page:

(56) References Cited    OTHER PUBLICATIONS

Please add the following Reference:

--Hideyuki Ichihara et al., "On Acceleration of Logic Circuits Optimization using Implication Relations," Technical Report of IEICE., Japan, The Institute of Electronics, Information and Communication Engineers, February 13, 1997, Vol. 96, No. 519, pp.57-64.--

Signed and Sealed this

Sixth Day of July, 2010

David J. Kappos
*Director of the United States Patent and Trademark Office*